(12) United States Patent
Kuribayashi

(10) Patent No.: US 10,090,176 B2
(45) Date of Patent: Oct. 2, 2018

(54) TEMPERATURE ADJUSTMENT DEVICE

(71) Applicant: Shinko Electric Industries Co., LTD., Nagano-ken (JP)

(72) Inventor: Akihiro Kuribayashi, Nagano (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 315 days.

(21) Appl. No.: 14/641,678

(22) Filed: Mar. 9, 2015

(65) Prior Publication Data

US 2015/0270149 A1 Sep. 24, 2015

(30) Foreign Application Priority Data

Mar. 20, 2014 (JP) ................................. 2014-057751

(51) Int. Cl.
*H01L 21/67* (2006.01)
*H05B 3/68* (2006.01)
*H05B 3/26* (2006.01)

(52) U.S. Cl.
CPC .. *H01L 21/67103* (2013.01); *H01L 21/67248* (2013.01)

(58) Field of Classification Search
CPC ....... H01L 21/67; H01L 21/673; H01L 21/68; H01L 21/67103; H01L 21/67242; H01L 21/67309
USPC ....................................................... 219/444.1
See application file for complete search history.

(56) References Cited

U.S. PATENT DOCUMENTS

| 6,310,755 | B1* | 10/2001 | Kholodenko | C04B 35/185 |
| | | | | 361/115 |
| 2005/0045618 | A1* | 3/2005 | Ito | B32B 18/00 |
| | | | | 219/444.1 |
| 2007/0045239 | A1* | 3/2007 | Taylor | H01J 37/3244 |
| | | | | 219/121.5 |
| 2011/0017706 | A1* | 1/2011 | Takahashi | H01J 37/32192 |
| | | | | 216/69 |
| 2012/0299253 | A1* | 11/2012 | Kosakai | H01L 21/67103 |
| | | | | 279/128 |

FOREIGN PATENT DOCUMENTS

| JP | 11-008290 | 1/1999 |
| JP | 2008-166509 | 7/2008 |

* cited by examiner

*Primary Examiner* — Brian Jennison
(74) *Attorney, Agent, or Firm* — Wolf, Greenfield & Sacks, P.C.

(57) ABSTRACT

A temperature adjustment device includes a holding plate having a placing surface on which a processed substrate is placed. The holding plate includes a heating element capable of heating the processed substrate placed on the placing surface. A base plate that supports the holding plate includes first through holes extending through the base plate in a thickness direction. An adhesive layer, which adheres the base plate and the holding plate, includes second through holes that are respectively in communication with the first through holes. Adjustment rods are respectively inserted into the first through holes. Each of the adjustment rods includes a distal end located in a corresponding one of the second through holes.

6 Claims, 2 Drawing Sheets

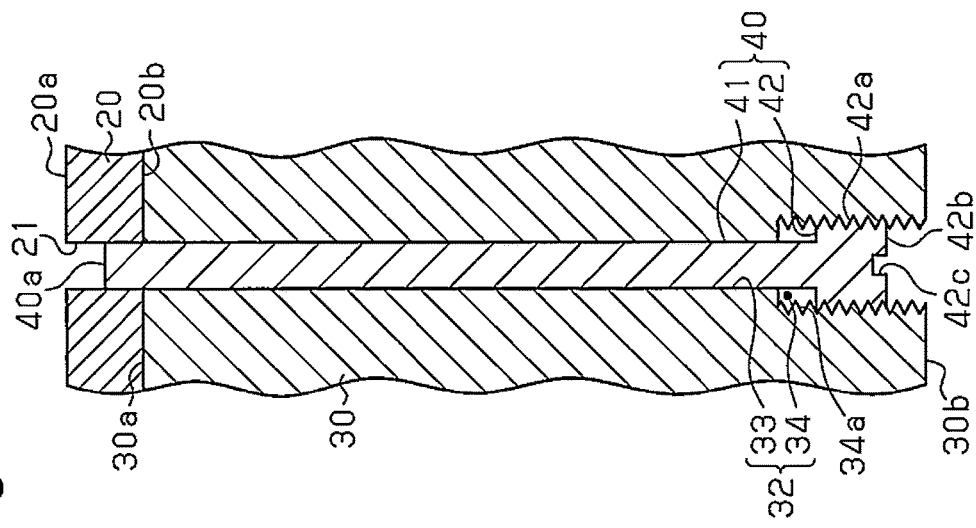
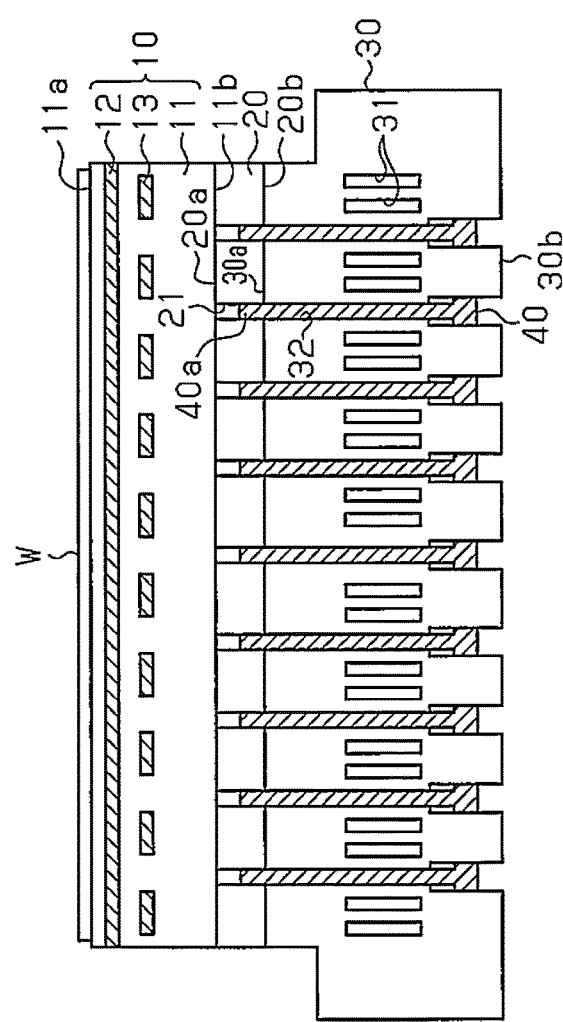

TEMPERATURE ADJUSTMENT DEVICE

CROSS-REFERENCE TO RELATED APPLICATIONS

This application is based upon and claims the benefit of priority from prior Japanese Patent Application No. 2014-057751, filed on Mar. 20, 2014, the entire contents of which are incorporated herein by reference.

FIELD

This disclosure relates to a temperature adjustment device.

BACKGROUND

A semiconductor manufacturing device, such as a film forming device (e.g., CVD device or PVD device) or a plasma etching device, is used to form a semiconductor device. Such manufacturing devices include a temperature adjustment device that adjusts the temperature of a substrate (e.g., silicon wafer) in a pressure-reduced chamber. For example, an electrostatic chuck (ESC) is used as a temperature adjustment device. The electrostatic chuck has an electrostatic chuck plate bonded on a base plate. Japanese Laid-Open Patent Publications No. 11-8290 and No. 2008-166509 describe examples of the electrostatic chuck plate. For example, the electrostatic chuck plate includes an electrode capable of attracting a substrate and a heating element controlling the temperature of the subject to be attracted (i.e., substrate). The temperature of the substrate attracted on the electrostatic chuck plate is adjusted by a coolant flowing through a conduit formed in the base plate and the heating element incorporated in the electrostatic chuck plate.

The heat density may vary in the heating element incorporated in the electrostatic chuck plate. Such variation in the heat density causes variations in the temperature of the substrate. This may vary, for example, the etching rate of the plasma etching device and thereby lower the yield of the semiconductor device.

SUMMARY

One aspect of this disclosure is a temperature adjustment device. The temperature adjustment device includes a holding plate. The holding plate includes a placing surface on which a processed substrate is placed. The holding plate also includes a heating element capable of heating the processed substrate placed on the placing surface. The temperature adjustment device further includes a base plate that supports the holding plate. The base plate includes a plurality of first through holes that extend through the base plate in a thickness direction. The temperature adjustment device further includes an adhesive layer that adheres the base plate and the holding plate. The adhesive layer includes a plurality of second through holes that are respectively in communication with the plurality of first through holes. The temperature adjustment device further includes a plurality of adjustment rods that are respectively inserted into the plurality of first through holes. Each of the adjustment rods includes a distal end that is located in a corresponding one of the second through holes.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic sectional view of an electrostatic chuck that serves as a temperature adjustment device;

FIG. 1B is a partially enlarged cross-sectional view of the electrostatic chuck of FIG. 1A;

DESCRIPTION OF THE EMBODIMENTS

Figure 2:
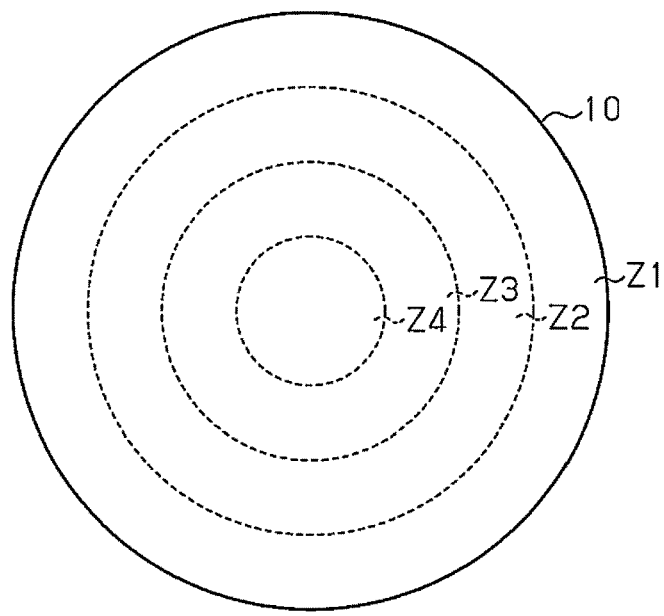
FIG. 2 is a schematic plan view illustrating an example of zones (temperature adjustment regions) defined in the electrostatic chuck of FIG. 1A.

One embodiment will now be described with reference to the accompanying drawings. Elements in the drawings are illustrated for simplicity and clarity and have not necessarily been drawn to scale. In the cross-sectional views, some reference numerals and hatching of some elements are omitted.

As illustrated in FIG. 1A, an electrostatic chuck (ESC) that serves as a temperature adjustment device includes an electrostatic chuck plate 10 that serves as a holding plate, an adhesive layer 20, and a base plate 30. The base plate 30 supports the electrostatic chuck plate 10.

The electrostatic chuck plate 10 includes a plate body 11, a plurality of electrostatic electrodes 12, and a plurality of resistance heating elements 13. The electrostatic electrodes 12 and the resistance heating elements 13 are incorporated in the plate body 11. In FIG. 1A, one of the electrostatic electrodes 12 is illustrated. The plate body 11 has a substrate placing surface 11a (upper surface in FIG. 1A) and an adhesive surface 11b (lower surface in FIG. 1A) located on the opposite side of the substrate placing surface 11a. The substrate placing surface 11a and the adhesive surface 11b are parallel to each other. The electrostatic chuck plate 10 is formed to have a disk-like shape. The electrostatic chuck plate 10 has a size (diameter) of, for example, 300 mm and a thickness of, for example, 5 mm. A substrate W (processed substrate) is placed on the substrate placing surface 11a. In the following description, to facilitate understanding, the plate body 11 may also be referred to the electrostatic chuck plate 10.

The plate body 11 is made from an insulating material. For example, the material of the plate body 11 may be a ceramics, such as alumina, aluminum nitride, or silicon nitride, or an organic material, such as a silicone resin or a polyimide resin. In the present embodiment, a ceramics, such as alumina or aluminum nitride, is used in terms of ready availability, easiness to machine, relatively high resistance to plasma, and the like. In particular, aluminum nitride has a relatively high heat conductivity of 150 to 250 W/(m·K) and is thus preferable for reducing the in-plane temperature variation of the subject (in this case, substrate W) to be attracted by the electrostatic chuck plate 10.

The electrostatic electrodes 12 are thin-film electrodes. The electrostatic electrodes 12 are incorporated in the plate body 11 proximate to the substrate placing surface 11a. The electrostatic electrodes 12 are electrically connected to an attraction power supply (not illustrated). The electrostatic electrodes 12 use the voltage applied by the attraction power supply to generate electrostatic force that fixes the substrate W to the substrate placing surface 11a. As the material of the electrostatic electrodes 12, for example, tungsten (W) or molybdenum (Mo) may be used. Although FIG. 1A illustrates the electrostatic electrode 12 as a single electrode, the electrostatic electrode 12 includes a plurality of electrodes arranged on the same plane.

The resistance heating elements 13 are incorporated in the plate body 11 between the electrostatic electrodes 12 and the adhesive surface 11b. The resistance heating elements 13 are arranged along a plane parallel to the substrate placing surface 11a. The resistance heating elements 13 are electrically insulated from the electrostatic electrodes 12.

The resistance heating elements 13 are electrically coupled to a heating power supply (not illustrated). The resistance heating elements 13 generate heat based on the voltage applied by the heating power supply. The resistance heating elements 13 are arranged in temperature adjustment regions (zones), which are defined in the plate body 11, and controlled independently in each of the zones. As the material of the resistance heating elements 13, for example, tungsten (W) or molybdenum (Mo) may be used. For example, the electrostatic chuck plate 10 is formed by laminating a plurality of green sheets which includes a green sheet on which tungsten is printed and then baking the green sheets.

As illustrated in FIG. 2, for example, zones Z1, Z2, Z3, and Z4 are defined in the electrostatic chuck plate 10 in a concentric manner. The resistance heating elements 13 illustrated in FIG. 1A are controlled in each of the zones Z1 to Z4 to uniform the temperature of the entire substrate W.

The electrostatic chuck plate 10 is adhered to an upper surface 30a of the base plate 30 by the adhesive layer 20. The adhesive layer 20 has heat conductivity to transmit heat of the electrostatic chuck plate 10 to the base plate 30. As the material of the adhesive layer 20, a material having high heat conductivity is preferably used. For example, a silicone resin may be used as the material of the adhesive layer 20. The adhesive layer 20 has a thickness of, for example, 1.0 mm to 1.5 mm.

The base plate 30 includes a conduit 31 which circulates a coolant. The coolant is, for example, water or Galden. For example, the conduit 31 is formed along a plane parallel to an upper surface 30a of the base plate 30.

Figure 3:
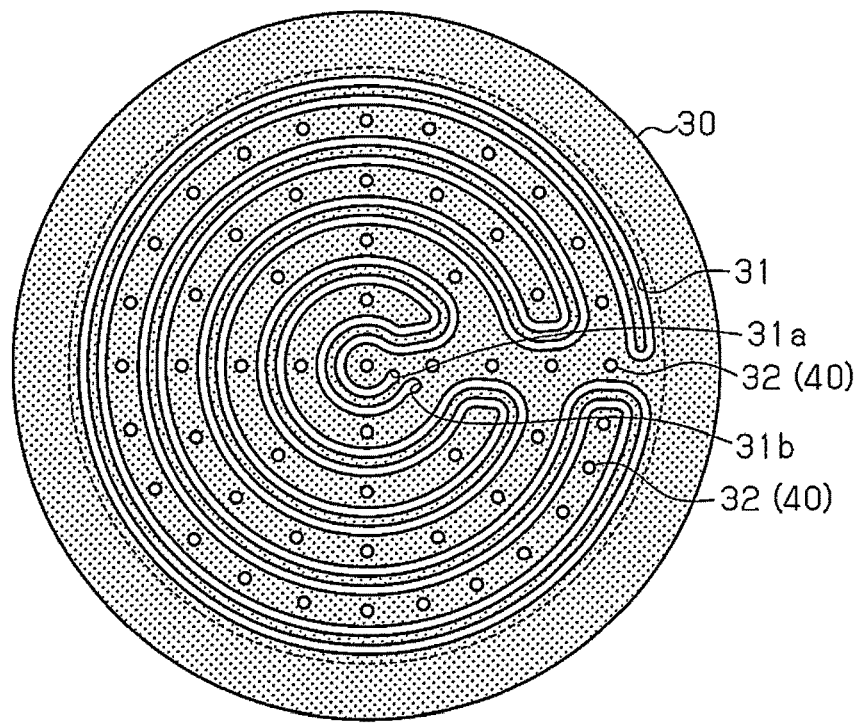
FIG. 3 is a schematic plan view illustrating the arrangement of a conduit and adjustment rods (through holes) in a base plate.

FIG. 3 illustrates one example of the conduit 31. The conduit 31 is formed to cool the base plate 30 as a whole with the coolant flowing through the conduit 31. The conduit 31 has an intake portion 31a, which is located at one end of the conduit 31 to take the coolant, and a discharge portion 31b, which is located at the other end of the conduit 31 to discharge the coolant. The conduit 31 is an example of a cooling mechanism.

As the material of the base plate 30, a metal material, such as aluminum or cemented carbide, a composite material of such a metal material and a ceramic material, or the like may be used. In the present embodiment, aluminum or an aluminum alloy is used in terms of ready availability, easiness to machine, high heat conductivity, and the like, and the upper surface 30a of the base plate 30 undergoes alumite processing to form an insulating film thereon. The base plate 30 has a thickness of, for example, 35 mm to 40 mm.

As illustrated in FIG. 1A, the base plate 30 includes a plurality of through holes 32 extending through the base plate 30 from the upper surface 30a to a lower surface 30b. For example, as illustrated in FIG. 3, the through holes 32 are arranged at a uniform density in the upper surface 30a or a plane parallel to the upper surface 30a of the base plate 30.

As illustrated in FIG. 1A, the adhesive layer 20 includes a plurality of through holes 21 that extend through the adhesive layer 20 from an upper surface 20a to a lower surface 20b to be in communication with the through holes 32 of the base plate 30. Adjustment rods 40 are inserted into the through holes 32 of the base plate 30. The adjustment rods 40 are supported by the base plate 30. Each of the adjustment rods 40 has a distal end 40a that is inserted into the corresponding one of the through holes 21 of the adhesive layer 20. As illustrated in FIG. 3, the conduit 31 extends through gaps between the adjustment rods 40 and is arranged to form a substantially concentric shape when the base plate 30 is viewed in the thickness direction.

The through holes 32 and the adjustment rods 40 of the base plate 30 will now be described below in detail. One of the through holes 32 and one of the adjustment rods 40 will be described. The other through holes 32 and the other adjustment rods 40 are similarly formed.

As illustrated in FIG. 1B, the through hole 32 has a support hole 33, which extends downward from the upper surface 30a, and an adjustment hole 34, which opens in the lower surface 30b and has a diameter larger than that of the support hole 33. A thread groove (female screw) 34a is formed on an inner surface of the adjustment hole 34. The through hole 21 has a diameter (internal diameter) that is equal to a diameter (internal diameter) of the support hole 33.

The adjustment rod 40 includes an insertion portion 41, which has the distal end 40a, and a support portion 42. The insertion portion 41 is inserted into the support hole 33 and the through hole 21. The support portion 42 is inserted into the adjustment hole 34. A thread ridge (male screw) 42a, which can be meshed with the screw groove 34a of the adjustment hole 34, is formed on an outer surface of the support portion 42. The adjustment rod 40 (insertion portion 41) has a diameter of, for example, 1 mm to 5 mm.

The length of the support portion 42 and the depth of the adjustment hole 34 are set depending on a moving range of the adjustment rod 40. In the present embodiment, the length of the support portion 42 and the depth of the adjustment hole 34 are set such that the distal end 40a of the adjustment rod 40 is located in the through hole 21 when the position of the adjustment rod 40 is adjusted within the moving range. Thus, the moving range of the adjustment rods 40 is set depending on the thickness of the adhesive layer 20.

A jig insertion portion 42c is formed on an end face 42b of the support portion 42. A jig (for example, a hexagonal bar wrench, a precision screwdriver, or the like), which is not illustrated, can be inserted in the jig insertion portion 42c. The support portion 42, i.e., the adjustment rod 40 is rotated by using the jig so as to adjust the position of the distal end 40a of the adjustment rod 40.

The adjustment rod 40 is made from a material having heat conductivity higher than that of the adhesive layer 20. As the material of the adjustment rod 40, a metal material, such as aluminum or cemented carbide, a composite material of such a metal material and a ceramic material, or the like may be used. In the present embodiment, aluminum or an aluminum alloy is used in terms of ready availability, easiness to machine, high heat conductivity, and the like.

The operation of the electrostatic chuck will now be described below.

The resistance heating elements 13 of the electrostatic chuck plate 10 generate heat by energizing the resistance heating elements 13 to heat the substrate W placed on the substrate placing surface 11a. The base plate 30 is cooled with a coolant. Thus, heat of the electrostatic chuck plate 10 is transmitted to the base plate 30 through the adhesive layer 20. Heat generation by the resistance heating elements 13 and cooling by the base plate 30 control the temperature of an upper surface (substrate placing surface 11a) of the electrostatic chuck plate 10.

The resistance heating elements 13 have shapes to uniform the temperature of the substrate W placed on the substrate placing surface 11a. However, the shape of the resistance heating elements 13, for example, the width and the thickness of a wiring pattern may vary in the manufacturing process. Such variation in the shape causes resistance value variations partially, that is, heat generation amount variations in portions of the resistance heating elements 13. Thus, variations in the shape of the resistance heating elements 13 cause the temperature of the substrate placing surface 11a to be uneven. For example, when a manufacture value of a wiring pattern width is greater than its design value partially, the resistance values of the corresponding portions are decreased in accordance with the difference between the manufacture value and the design value. This lowers the heat generation temperature of the portions of the resistance heating elements 13 decreases. Similarly, the shape of the conduit 31 of the base plate 30 may vary in the manufacturing process. Such shape variation in the conduit 31 causes the temperature of the substrate placing surface 11a to be uneven.

Each of the adjustment rods 40 is supported by the base plate 30 to be movable in the corresponding through holes 21 and 32. Further, the distal end 40a of each of the adjustment rods 40 is located in the corresponding through hole 21. Thus, heat of the electrostatic chuck plate 10 is transmitted to the base plate 30 through the adjustment rods 40 and the adhesive layer 20. Here, the adjustment rods 40 have heat conductivity higher than that of the adhesive layer 20. Therefore, the temperature of the electrostatic chuck plate 10 near the through holes 21 of the adhesive layer 20 changes in accordance with the difference between the heat conductivity of the adjustment rods 40 and the heat conductivity of the adhesive layer 20. For example, when the difference between the heat conductivity of the adjustment rods 40 and the heat conductivity of the adhesive layer 20 increases, the temperature near the through holes 21 decreases. Thus, the adjustment rods 40 change the temperature of the electrostatic chuck plate 10 within a range depending on the diameter of the adjustment rods 40, that is, the internal diameter of the through holes 21.

Further, the temperature of the electrostatic chuck plate 10 near the through holes 21 of the adhesive layer 20 changes in accordance with the distance from the adhesive surface 11b of the electrostatic chuck plate 10 to the distal end 40a of each of the adjustment rods 40 in the through holes 21. When the distance between the distal end 40a of each of the adjustment rods 40 and the adhesive surface 11b of the electrostatic chuck plate 10 decreases, heat is more efficiently transmitted from the electrostatic chuck plate 10 to the adjustment rods 40. Consequently, the temperature near the through holes 21 decreases.

For example, the position of the distal end 40a of each of the adjustment rods 40 in the through holes 21 is adjusted based on the measurement result of the temperature of the substrate placing surface 11a of the electrostatic chuck plate 10. In the temperature measurement, a contact thermometer (for example, a thermometer using a thermocouple) or a non-contact thermometer (for example, an infrared thermometer) may be used. By adjusting the position of the distal end 40a of each of the adjustment rods 40, the heat density and the heat density distribution on the substrate placing surface 11a of the electrostatic chuck plate 10 are adjusted. In this manner, the temperature of the substrate W attracted and held by the substrate placing surface 11a of the electrostatic chuck plate 10 may be uniformly controlled.

The adjustment rods 40 are inserted into the through holes 32 of the base plate 30. For example, the position of the distal end 40a of each of the adjustment rods 40 can be adjusted by using the jig at the side of the lower surface 30b of the base plate 30 while measuring the temperature of the substrate placing surface 11a. In this manner, the temperature of the substrate placing surface 11a of the electrostatic chuck plate 10 may be easily changed near each of the adjustment rods 40.

The present embodiment has the following advantages.

(1) The substrate W is placed on the substrate placing surface 11a of the electrostatic chuck plate 10. The electrostatic chuck plate 10 includes the resistance heating elements 13 for heating the substrate W. The electrostatic chuck plate 10 is adhered on the upper surface 30a of the base plate 30 by the adhesive layer 20. The through holes 32 extend through the base plate 30 from the upper surface 30a to the lower surface 30b. The through holes 21 extend through the adhesive layer 20 to be in communication with the through holes 32 of the base plate 30. The adjustment rods 40 are inserted into the through holes 32 and supported by the base plate 30. The distal ends 40a of the adjustment rods 40 are located in the through holes 21 of the adhesive layer 20.

The temperature of the electrostatic chuck plate 10 near the through holes 21 of the adhesive layer 20 changes in accordance with the distance from the distal end 40a of each of the adjustment rods 40 in the through holes 21 to the adhesive surface 11b of the electrostatic chuck plate 10. When the distance between the distal end 40a of each of the adjustment rods 40 and the adhesive surface 11b of the electrostatic chuck plate 10 decreases, heat is more efficiently transmitted from the electrostatic chuck plate 10 to the adjustment rods 40. This lowers the temperature near the through holes 21. Thus, by measuring the temperature of the substrate placing surface 11a of the electrostatic chuck plate 10 and changing the position of the distal end 40a of each of the adjustment rods 40 based on the temperature measurement result, the heat density and the heat density distribution on the substrate placing surface 11a can be adjusted. Accordingly, the temperature of the substrate W attracted and held by the substrate placing surface 11a of the electrostatic chuck plate 10 may be uniformly controlled.

(2) The adjustment rods 40 are screwed into the through holes 32 of the base plate 30. Thus, the positions of the distal ends 40a of the adjustment rods 40 can be adjusted at the side of the lower surface 30b of the base plate 30 while measuring the temperature of the substrate placing surface 11a. Accordingly, the temperature of the substrate placing surface 11a of the electrostatic chuck plate 10 may be easily controlled.

It should be apparent to those skilled in the art that the present invention may be embodied in many other specific forms without departing from the scope of the invention. Particularly, it should be understood that the present invention may be embodied in the following forms.

In the foregoing embodiment, as long as the heat density on the substrate placing surface 11a of the electrostatic chuck plate 10 can be adjusted, the material of the adjustment rods 40 may be appropriately changed. Thus, the material of the adjustment rods 40 is not limited to the same material as that of the base plate 30. For example, the adjustment rods 40 may be made from a material having heat conductivity lower than that of the base plate 30. Further, a material having heat conductivity equal to or smaller than that of the adhesive layer 20 may be used for the adjustment rods 40.

In the foregoing embodiment, the positions of the through holes 21 and 32 in which the adjustment rods 40 are arranged may be appropriately changed. For example, at the position at which the temperature variation in the substrate placing surface 11a is large, arrangement intervals of the adjustment rods 40 may be narrower. In this manner, the arrangement density of the adjustment rods 40 may be changed in accordance with on the temperature distribution of the substrate placing surface 11a of the electrostatic chuck plate 10.

The present examples and embodiments are to be considered as illustrative and not restrictive, and the invention is not to be limited to the details given herein, but may be modified within the scope and equivalence of the appended claims.

The invention claimed is:

1. A temperature adjustment device comprising:
    a holding plate including a placing surface on which a processed substrate is placed, wherein the holding plate includes a heating element capable of heating the processed substrate placed on the placing surface;
    a base plate that supports the holding plate, wherein the base plate includes a plurality of first through holes that extend through the base plate in a thickness direction, wherein the plurality of first through holes are arranged at a uniform density so that the plurality of first through holes are evenly spaced in a plurality of concentrically smaller circles in the base plate overlapping the placing surface in a plan view and so that each of the plurality of concentrically smaller circles contains two or more of the plurality of first through holes;
    an adhesive layer that adheres the base plate and the holding plate, wherein the adhesive layer includes a plurality of second through holes that are respectively in communication with the plurality of first through holes; and
    a plurality of adjustment rods that are respectively inserted into the plurality of first through holes, wherein
    each of the plurality of adjustment rods includes a distal end that is located in a corresponding one of the plurality of second through holes so that a heat density distribution on the placing surface can be adjusted by adjusting a position of the distal end of each of the plurality of adjustment rods within the corresponding one of the plurality of second through holes,
    the plurality of adjustment rods are movable independently each other, and
    a moving range of each of the plurality of adjustment rods is limited to a range in which the distal end of each of the plurality of adjustment rods is located in the corresponding one of the plurality of second through holes.

2. The temperature adjustment device according to claim 1, wherein each of the plurality of adjustment rods has a heat conductivity that differs from that of the adhesive layer.

3. The temperature adjustment device according to claim 1, wherein each of the plurality of adjustment rods has a heat conductivity higher than that of the adhesive layer.

4. The temperature adjustment device according to claim 1, wherein the holding plate further includes an electrostatic electrode that is arranged between the placing surface and the heating element, and capable of attracting the processed substrate.

5. The temperature adjustment device according to claim 1, wherein the base plate further includes a conduit through which a coolant flows.

6. The temperature adjustment device according to claim 1, wherein
    the base plate further includes a conduit through which a coolant flows, and
    the conduit extends through gaps between the plurality of adjustment rods and is arranged to form a substantially concentric shape when the base plate is viewed in the thickness direction.

* * * * *